United States Patent
Graafmans

(10) Patent No.: US 6,611,853 B2
(45) Date of Patent: Aug. 26, 2003

(54) VXI TEST INSTRUMENT AND METHOD OF USING SAME

(75) Inventor: Adrian J. Graafmans, Newport Beach, CA (US)

(73) Assignee: VXI Technology, Inc., Irvine, CA (US)

( * ) Notice: Subject to any disclaimer, the term of this patent is extended or adjusted under 35 U.S.C. 154(b) by 0 days.

(21) Appl. No.: 09/158,933

(22) Filed: Sep. 22, 1998

(65) Prior Publication Data

US 2002/0173869 A1 Nov. 21, 2002

(51) Int. Cl.[7] ............................................... G06F 19/00
(52) U.S. Cl. .......................... 708/108; 700/298; 710/38; 710/8; 711/147
(58) Field of Search ............................... 700/108, 298; 361/788, 724, 725, 715, 683, 719; 323/257, 341, 272; 312/223

(56) References Cited

U.S. PATENT DOCUMENTS

| | | | | | |
|---|---|---|---|---|---|
| 4,719,459 A | * | 1/1988 | Kovecs et al. | ............... | 340/825 |
| 5,592,366 A | * | 1/1997 | Goldman et al. | ............ | 361/796 |
| 5,642,290 A | * | 6/1997 | Reilly et al. | ................ | 364/492 |
| 5,796,963 A | * | 8/1998 | Odom | ........................ | 395/308 |
| 5,847,955 A | * | 12/1998 | Mitchell et al. | ............. | 364/191 |
| 5,995,376 A | * | 11/1999 | Schultz et al. | ............... | 361/788 |
| 6,064,812 A | * | 5/2000 | Parthasarathy et al. | ...... | 395/701 |
| 6,073,188 A | * | 6/2000 | Fleming | ....................... | 710/38 |
| 6,085,156 A | * | 7/2000 | Rust et al. | .................... | 702/91 |
| 6,102,965 A | * | 8/2000 | Dye et al. | ....................... | 717/1 |
| 6,108,198 A | * | 8/2000 | Lin | ............................. | 361/683 |
| 6,166,324 A | * | 12/2000 | Oldendorf et al. | ............ | 174/35 |
| 6,351,786 B2 | * | 2/2002 | Elmore et al. | .............. | 710/300 |

* cited by examiner

Primary Examiner—James P. Trammell
Assistant Examiner—Firmin Backer
(74) Attorney, Agent, or Firm—William J. Kolegraff

(57) ABSTRACT

The modular switch instrument card has a single or double slot card frame having a front panel. The card frame has module receiving areas for receiving selected switch modules. Each switch module is configured to provide a particular switching function. One or more switch modules may be positioned into the module receiving areas such that switch connectors on the switch modules extend through the front panel and are available for connection to an automated test system. The switch modules may be fixedly mounted within the card frame or may be removably coupled. Each switch module couples to an interconnect bus backplane enabling all installed switch modulars to communicate to a switch interface. The switch interface provides a communication interface to the VXI backplane, thereby providing a uniform and consistent programming interface independent of which switch modules are presently installed into the module receiving areas.

14 Claims, 7 Drawing Sheets

VXI TEST INSTRUMENT AND METHOD OF USING SAME

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO A "MICROFICHE APPENDIX"

Not Applicable

BACKGROUND OF THE INVENTION

1. Technical Field

The field of the present invention is electronic test instrumentation. More particularly, the field relates to a card based switch system for use in a C sized VXI electronic test system.

2. Background Art

Automated test systems are used to help manufacturers improve production quality and throughput. These automated test systems comprise multiple electronic test instruments such as voltmeters, power supplies and digital scopes. By automating the testing process, a manufacturer is able to more accurately and more efficiently test products for compliance with internal specifications and customer requirements. Traditionally, automated test equipment systems have been built using instrumentation which fits into a 19 inch wide rack system. Such systems were bulky, heavy and difficult to interconnect. Interconnection was not only physically a problem but limited the speed at which the entire system could operate, thus degrading test system throughput.

In response for the need for a more compact and more efficient automated test system, the automated test system industry developed a standard now commonly referred to as the "VXI" standard. VXI defines the physical and electrical interconnection between automated test equipment from manufacturers complying with the standard. With VXI a test system integrator chooses a VXI chassis and then selects VXI card based instrumentation specific to the test requirements.

The VXI chassis has a frame containing multiple slots. Each slot is configured to receive an instrumentation card. A card taking up one slot is referred to as a single slot VXI instrument. To use the instrument, the instrument card is slid into one of the slots of the VXI chassis until connectors on the back of the card couple with a VXI backplane on the back of the VXI chassis. The VXI backplane is a high speed communication bus which not only provides power for the VXI instrument card but allows instruments within a chassis to communicate and allows interconnection between multiple VXI chassis.

Although many test instruments are available in the single slot VXI configuration, several instruments are too complex and require a larger card frame. For such complex instruments, the VXI standard allows an instrument card to take up multiple slots. For example, a VXI instrument card taking up two slots is referred to as a double slot VXI card.

One of the key instrument functions in any automated test equipment system, including a VXI system, are switches. Switches are used to route electrical signals in an automated test equipment system. For example, a power source may need to be sequentially applied to a series of test points. A switch instrument allows a single power source to connect to the first test point, then connect to the second test point, and finally break the connection to the first test point. The switch may continue in a like manner until all test points have been sequentially activated.

For an advanced automated test equipment system, typically several different types of switches are needed. For example, power switches are used for directing a power source within the test system. These power switches are configured to withstand typical test system voltages and higher current. Due to the high current requirements the power switches have fewer relay points per card. General purpose switch cards are designed for switching low level and low frequency signals that are less than two amps and operating at less than about 20 megahertz frequencies. However, even the general purpose switch cards are available in several configurations depending upon the particular need of the automated test system.

For example, general purpose cards are available having single pole single throw, single pole double throw, double pole single throw, or double pole double throw configurations. Further, various topologies are designed into switches depending upon the particular test application. A tree topology allows one input channel to selectively be applied to one of many output channels. A "multiplexer" topology allows a single input to be connected to several outputs at one time, and a "matrix" topology allows any of a multiple inputs to be selectively connected to any of a multiple of outputs. Thus, depending upon the current, frequencies, and other design considerations, various types of switches may be needed.

Indeed, it is typical for a VXI system to require two or more types of switches. Thereby a VXI test system integrator selects a first VXI switch card to solve a first switching need and then must select a second VXI card to solve the second switching need. Therefore, typical VXI configurations have several VXI chassis slots dedicated to switching. With VXI, efficiency and throughput is primarily gained through test density and conservation of space. It is therefore highly disadvantageous to use multiple VXI slots to accommodate multiple switching needs.

Therefore, a system integrator must choose between reducing the number of types of switch cards needed and use switch configurations that are less than optimal, or must use the optimal configuration of switch cards but sacrifice the slot space within the VXI chassis.

Ascor Incorporated, a Giga-Tronics company, has attempted to solve this problem by providing a multi slot VXI module with variable instruments cards. This multi slot VXI configuration has a chassis that accepts individual switch cards. This multi slot chassis fits into the standard VXI chassis. With Ascor, the smallest multi slot chassis completely occupies three slots in the VXI chassis. This three slot chassis can then accommodate up to six switch cards. Thereby, a system integrator choosing the Ascor switching system loses a minimum of three slots in the VXI chassis.

As test density is a high priority in selecting VXI instrumentation, several manufacturers provide multiple instruments configured into a single VXI card. For example, VXI Technology, Inc. offers a VXI modular instrumentation platform that hosts up to three instrumentation modules in a VXI slot card. However, each instrument placed in the VXI module instrumentation platform is a fully functioning VXI instrument. Thereby, each instrument has local intelligence on each module. Further, as the modular instrument platform is designed to accommodate instrumentation other than switches, any switch module is necessarily designed in a form factor not optimized for switch density.

Therefore, there exists a need in the VXI automated test environment for a switch system allowing greater flexibility in choosing switch types while maximizing the test density advantages in a VXI test system. Further there exists a need to modularize switch topologies and increase densities in a smaller footprint.

SUMMARY OF THE INVENTION

It is an object of the present invention to provide a VXI instrument card for providing switching services to an automated test equipment system. It is a further object of the invention that this VXI instrumentation card provides a scaleable configuration and also provides different types of switches in a single VXI card as required by particular test system requirements. It is a further object of the present invention that such configuration flexibility be provided in a single or double slot instrumentation card. It is also an object of the present invention to maximize the density of switch relays in a VXI instrument card.

Therefore, to overcome the disadvantages in the prior art and meet the objectives of the invention, a VXI modular switch instrument card is herein disclosed.

The modular switch instrument card has a single or double slot VXI bus card frame having a front panel. The card frame has module receiving areas for receiving selected switch modules. Each switch module is configured to provide a particular switching function. One or more switch modules may be positioned into the module receiving areas such that switch connectors on the switch modules extend through the front panel and are available for connection to an automated test system. The switch modules may be fixedly mounted within the card frame or may be removably coupled. Each switch module couples to an interconnect bus backplane enabling all installed switch modulars to communicate to a switch interface. The switch interface provides a communication interface to the VXI backplane, thereby providing a uniform and consistent programming interface independent of which switch modules are presently installed into the module receiving areas.

The above-disclosed modular switch instrumentation card allows a system integrator to modularly configure a single or double slot VXI instrument card to have the various switch types and topologies as required for a particular test system. Thereby a system integrator may select the switches optimum for a particular application while still dedicating only one or two slots of the VXI chassis to switching instrumentation. Such increased flexibility and density provides for increased test throughput and efficiencies.

BRIEF DESCRIPTION OF DRAWINGS

The above mentioned and other objects and features of this invention and the manner of attaining them will become apparent, and the invention itself will be best understood by reference to the following description of an embodiment of the invention in conjunction with the accompanying drawings. The drawings are not necessarily drawn to scale.

BEST MODE FOR CARRYING OUT THE INVENTION

Figure 5:
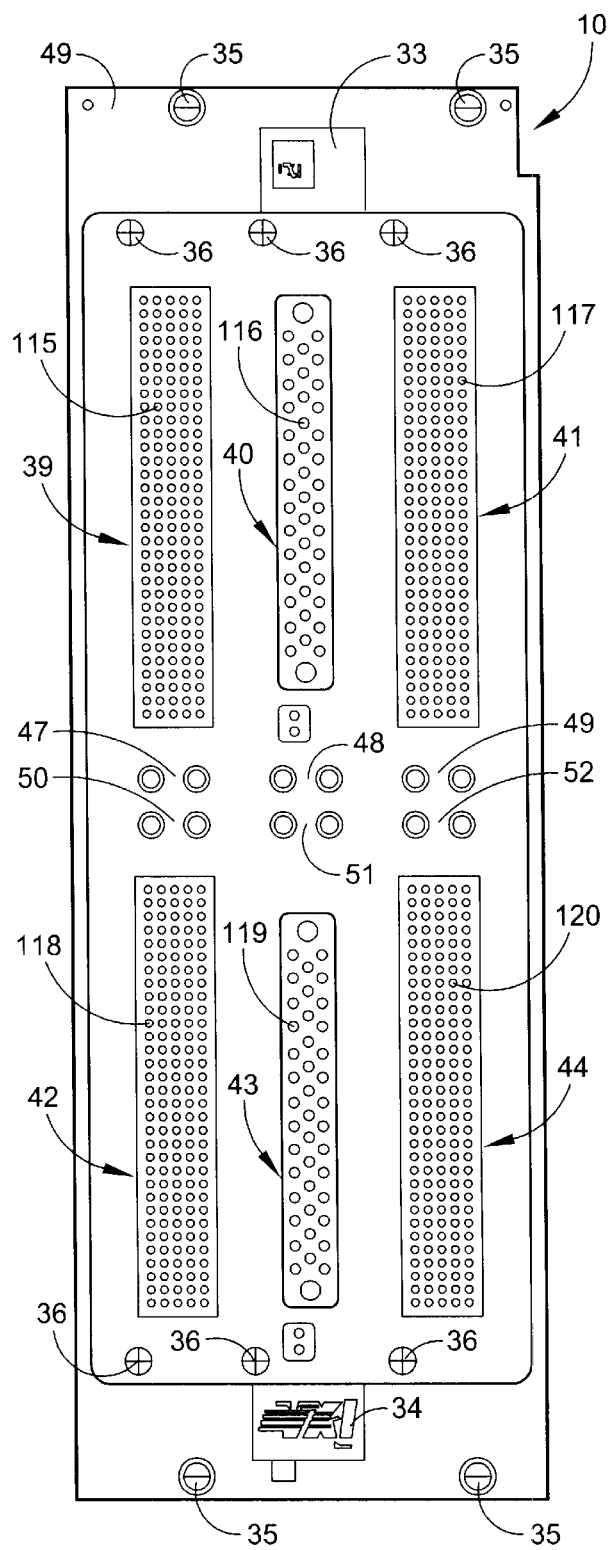
FIG. 5 is a front view of a double wide card frame having six switch modules made in accordance with the present invention.

FIG. 5 shows a modular switch instrument card 10 made in accordance with the present invention. The modular switch instrument card 10 has a double slot card frame 49 for holding a plurality of switch modules. FIG. 5 shows six switch modules 39–44 installed in the double slot card frame 49. Each switch module 39–44 has a switch connector 115–120 respectively for connecting the switch module to an external test system. Each of the switch modules 39–44 connect to an internal backplane which provides an interconnect bus for communications between each switch module and to a switch interface. The switch interface provides communication services to the standard VXI bus.

Figure 1:
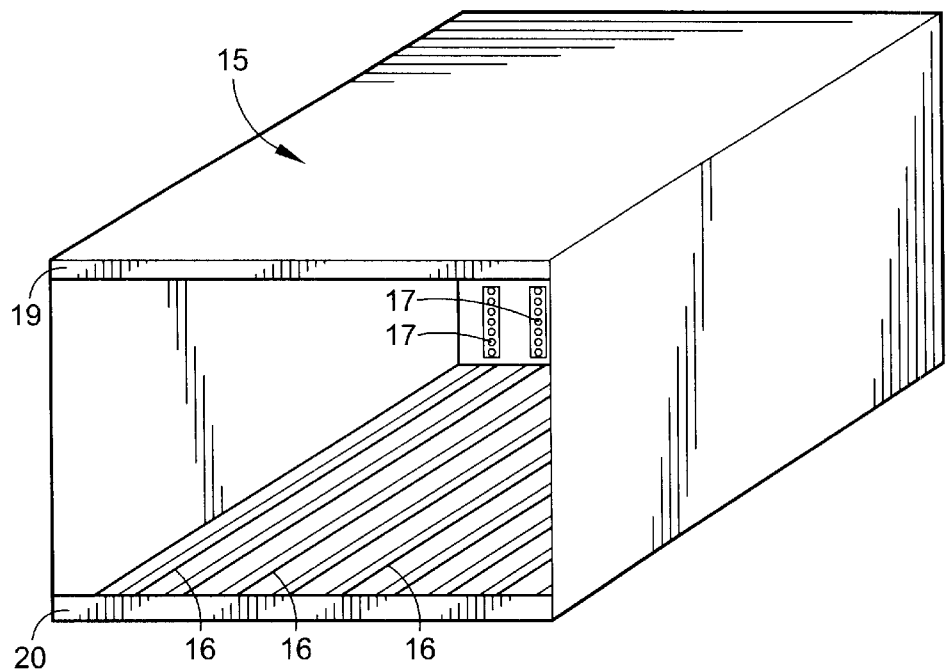
FIG. 1 shows a perspective view of a VXI chassis as in the prior art.

The module switch instrument card 10 is received into a VXI chassis 15 as shown in FIG. 1. The modular switch instrument card 10 is configured to align with slots 16 in the VXI chassis 15 such that the switch instrument card 10 is slidely received into the chassis 15. As the switch instrument card 10 is fully received into the chassis 15, VXI connectors at the rear of the switch instrument card 10 coupled with the VXI backplane connectors 17. Thereby the switch instrument card is physically and electrically coupled to the VXI backplane of the VXI chassis.

The modular switch instrument card 10 is also configured to couple with the top support rail 19 and the bottom support rail 20 of the VXI chassis. Such coupling with the support rails 19 and 20 provides additional physical attachment to the VXI chassis 15.

Turning now to discuss each component in more detail. Referring again to FIG. 5, the modular switch instrument card 10 has the double slot card frame 49 which couples to the top and bottom support rails 19 and 20. Support rail screws 35 securely but removably attach the double slot card frame 49 to the VXI chassis 15. When the modular switch instrument card 10 is securely positioned within the VXI chassis 15, connectors at the rear of the switch instrument card 10 are securely coupled with VXI backplane connector 17 on the VXI chassis 15. When the support rail screws 35 are loosened, top support ejector 33 and bottom support ejector 34 are used to assist in pulling the modular switch instrument card 10 from the chassis 15.

The modular switch instrument card 10 is a double wide instrument. Being a double wide instrument, the instrument takes up two slots within a VXI chassis. The double wide modular switch instrument card 10 is shown with six switch modules 39–44 installed. However, the modular switch instrument card can accommodate one, two, three, four, five or six installed modules. Those skilled in the art will recognize that although the modular switch instrument card 10 may receive up to six switch modules other maximum numbers may be selected consistent with the present invention. For example, fewer modules may be provided by allowing each module to have larger connectors. Also, more modules could be accommodated by providing switch modules with smaller connectors.

Figure 3:
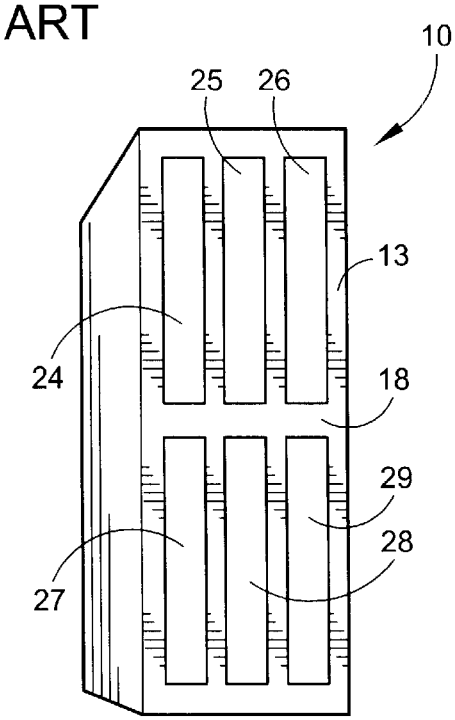
FIG. 3 is a diagrammatic perspective view of a double slot card frame made in accordance with the present invention.

The module switch instrument card also provides indicator lights 47–52 for each switch module 39–44 respectively. Referring now to FIG. 3, a double slot card frame 13 is shown. The double slot card frame 13 has a front plate 18 which has six slots. These module access slots 24–29 are covered with a protective covering if a switch module is not installed. Such protective covering keeps dust and other environmental pollutants from entering the switch instrument card 10 and also assures air flow requirements as defined in the VXI standard are met. These support covers may be secured with screws or may be of a knock-out variety. To install a switch module, the front connector of the switch module is positioned such that it extends through one of the module access slots 24–29. The switch module is secured to the double slot card frame both inside the chassis and by module attachment screws 36 as shown in FIG. 5.

Figure 7:
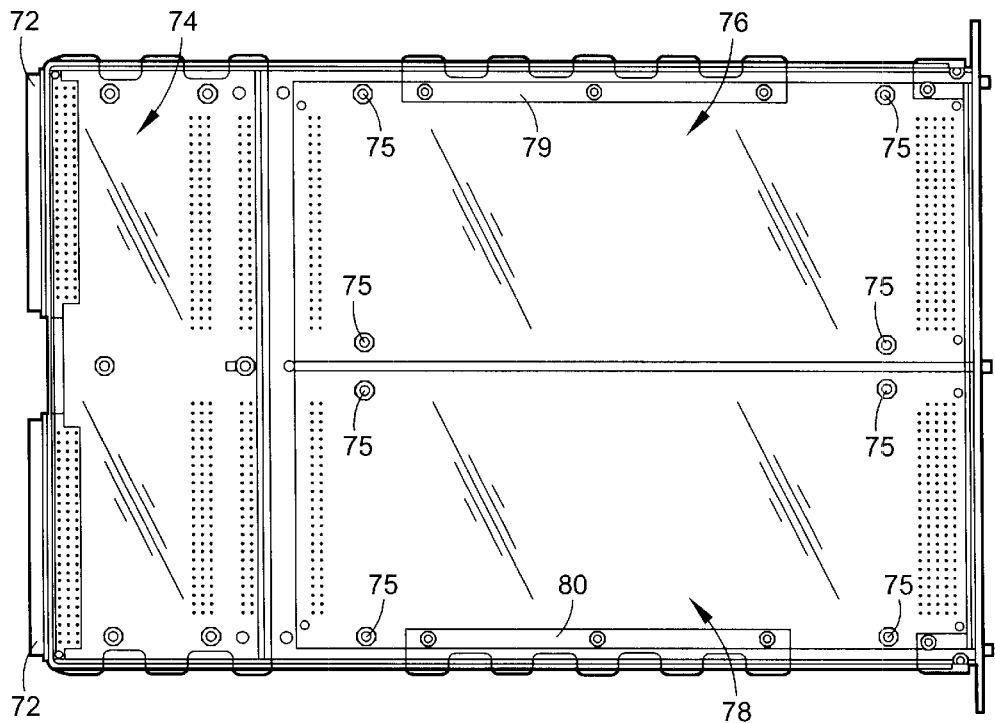
FIG. 7 is a side view of an empty card frame made in accordance with the present invention.
Figure 11:
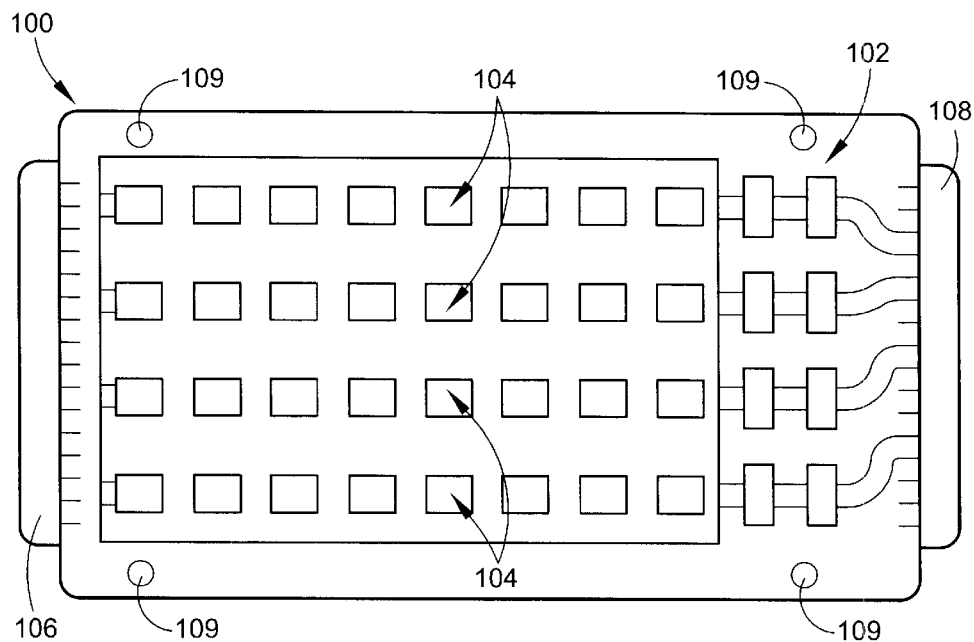
FIG. 11 is a diagrammatic side view of a switch module made in accordance with the present invention.

FIG. 7 shows a side view of a double wide card frame. Modules are installed into either the top module area 76 or the bottom module area 78. Both the top and bottom module areas 76 and 78 provide module mounting holes 75 for securing the switch module into the module area. Screws are connected to module mounting holes 75 and extend through the stack holes 109 of the switch modules 100 as shown in FIG. 11. By selecting the proper screw length, modules are properly positioned for allowing the switch connector 106 to protrude through the module access slots 24–29. Although the module switch instrument card 10 has switch modules that are fixedly attached by screw mounting means, those skilled in the art will readily recognize that modules may be provided which are slideably received through the module access slot 24–29. Rather than using screw mounting means, the module switch instrument card 10 would then use a slot and sliding rail configuration to position each switch module into the top and bottom module receiving area.

Referring now to FIG. 11, an individual switch module 100 made in accordance with the present invention is shown. The switch module generally comprises a switch connector for connecting to external test instrumentation. Relays 104 provide the electrical interconnection paths as required for the switch requirements. Different switch connectors 106 may be provided depending on the types and number of relays 104 positioned on the switch module 100. For example, a switch module may contain only a few power relays and therefore may allow for a smaller switch connector 106. If a high density matrix switch is needed, many relays 104 will be used to provide the matrix relay function and a large dense switch connector 106 will be necessary. The switch module 100 has a relay control area 102 providing the electrical circuitry necessary to operate and control the relay 104. The control area 102 has driver circuitry to activate specified relays. The relay control 102 also will vary depending on the number and type of relays 104 installed.

Figures 12, 13:
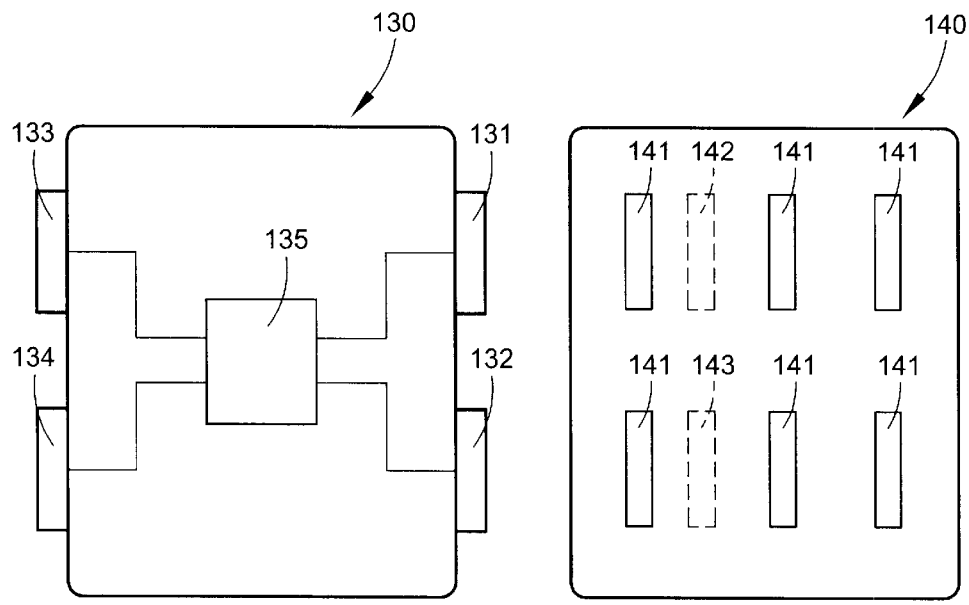
FIG. 12 is a diagrammatic view of a switch interface made in accordance with the present invention.
FIG. 13 is a diagrammatic view of an interconnect board made in accordance with the present invention.

The switch module 100 also has an interconnect bus connector 108 for connecting to a backplane and interconnect bus within the module switch instrument card. FIG. 13 shows the module interconnect board 140 providing the backplane and interconnect bus for the switch modules. The backplane comprises interconnect bus connectors 141 which connect to the individual switch modules. For example, interconnect bus connector 108 as shown in FIG. 11 would interface with any one of the interconnect bus connectors 141 as shown in FIG. 13. Although the connector is shown as one large connector in both FIGS. 11 and 13, those skilled in the art will readily recognize that such connection will be made by multiple sockets. Electrical interconnection is provided between interconnect bus connectors 141 and the interconnect board connectors 142 and 143. The interconnect board connectors 142 and 143 are shown hidden as they are positioned on the opposite side of the board as the interconnect bus connectors 141. The interconnect board connectors 142 and 143 physically and electrically coupled to interconnect board connectors 131 and 132 on the interface board 130 as shown in FIG. 12. The interconnect board connectors 131 and 132 route communications into gate array 135 with the gate array providing communication to the VXI bus via the VXI bus connectors 133 and 134. Thereby, a command may be received on the VXI bus and received into the gate array 135. The gate array 135 parses and processes the command and directs a low level instruction to a particular switch module. The individual switch module receives the low level command and a relay driver circuit causes a particular relay to open or close.

Using multiple switch modules communicating to a gate array through an interconnect bus allows a concentration of control that permits a maximum density of relays on each switch module.

Referring again to FIG. 7, 1 to 6 switch cards as defined above, may be installed into the top and bottom module receiving areas 76 and 78. Each of the installed modules has a switch connector extending through the front panel of the instrument card and an interconnect bus connector oriented toward the interface area 74. The interface area 74 has interface circuitry including a local backplane bus for providing communication between the installed switch modules and for providing communication from the installed modules to the interface. The interface communicates via the VXI bus connectors 72 with the VXI backplane. The card is inserted into the VXI chassis such that the upper slot rail 79 and the lower slot rail 80 properly track within slots within the VXI chassis.

Figure 8:
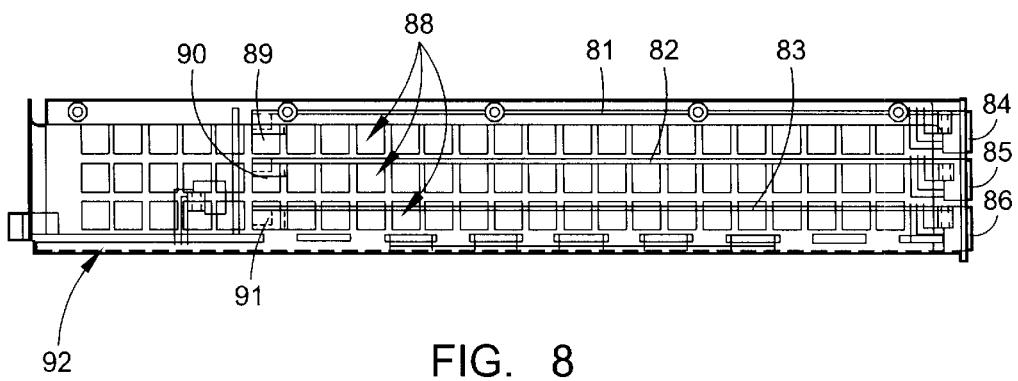
FIG. 8 is a top view of a double slot card frame showing three installed switch modules made in accordance with the present invention.

FIG. 8 shows a top view of a double slot switch instrument card with three switch modules installed. The switch modules 81, 82 and 83 are stacked using the screw mounting means described above allowing the switch connectors 84, 85 and 86 to extend from the front panel of the instrument. Each card has relays providing electrical switch functions with each module having an interconnect bus connector 89, 90 and 91 providing communication to the interconnect bus backplane, as described.

Figure 9:
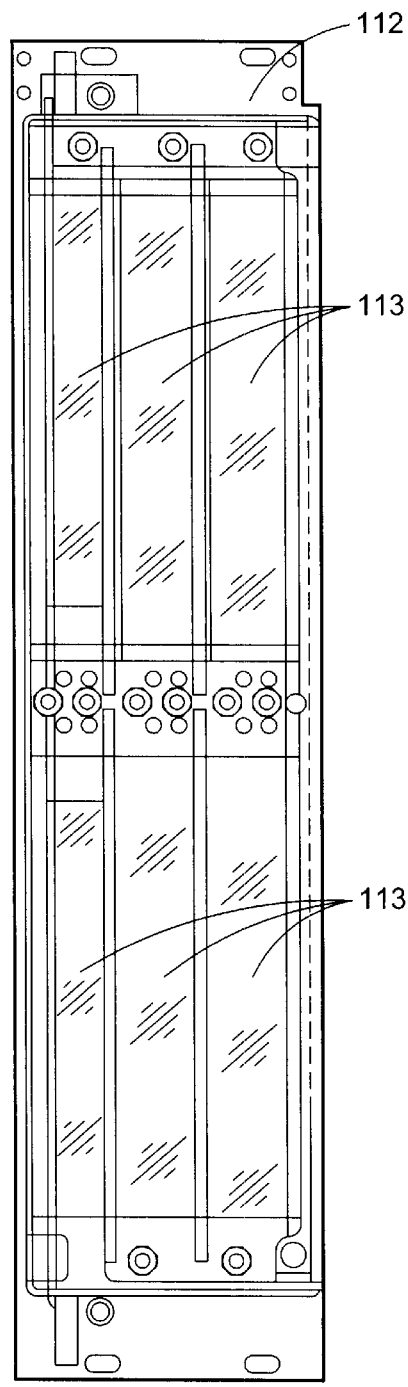
FIG. 9 shows a front view of the face plate for a double slot card frame made in accordance with the present invention.
Figure 10:
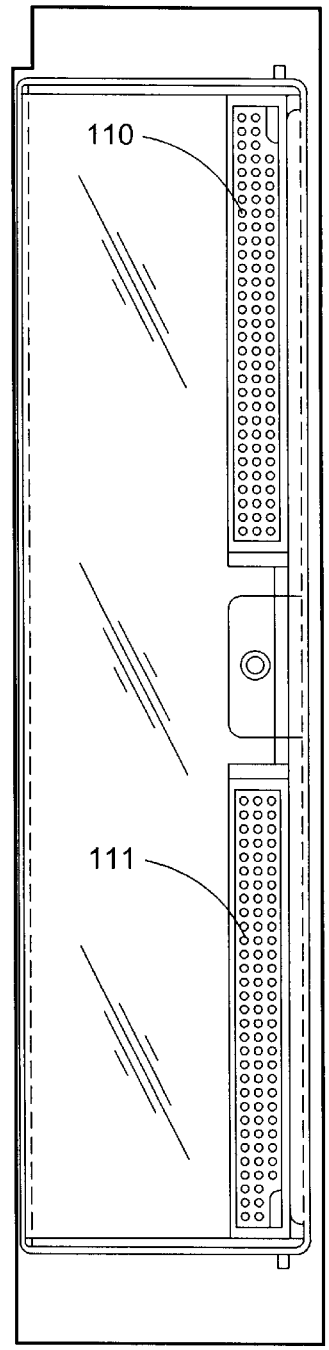
FIG. 10 is a rear view of a double slot card frame made in accordance with the present invention.

Referring now to FIG. 9, the double slot front panel 112 is shown in greater detail. The double slot front panel 112 has six module access slots 113, shown covered. FIG. 10 details the rear panel to the double slot card. VXI bus connectors 110 and 111 are positioned to electrically and physically couple with VXI backplane connectors on the VXI chassis.

Figure 6:
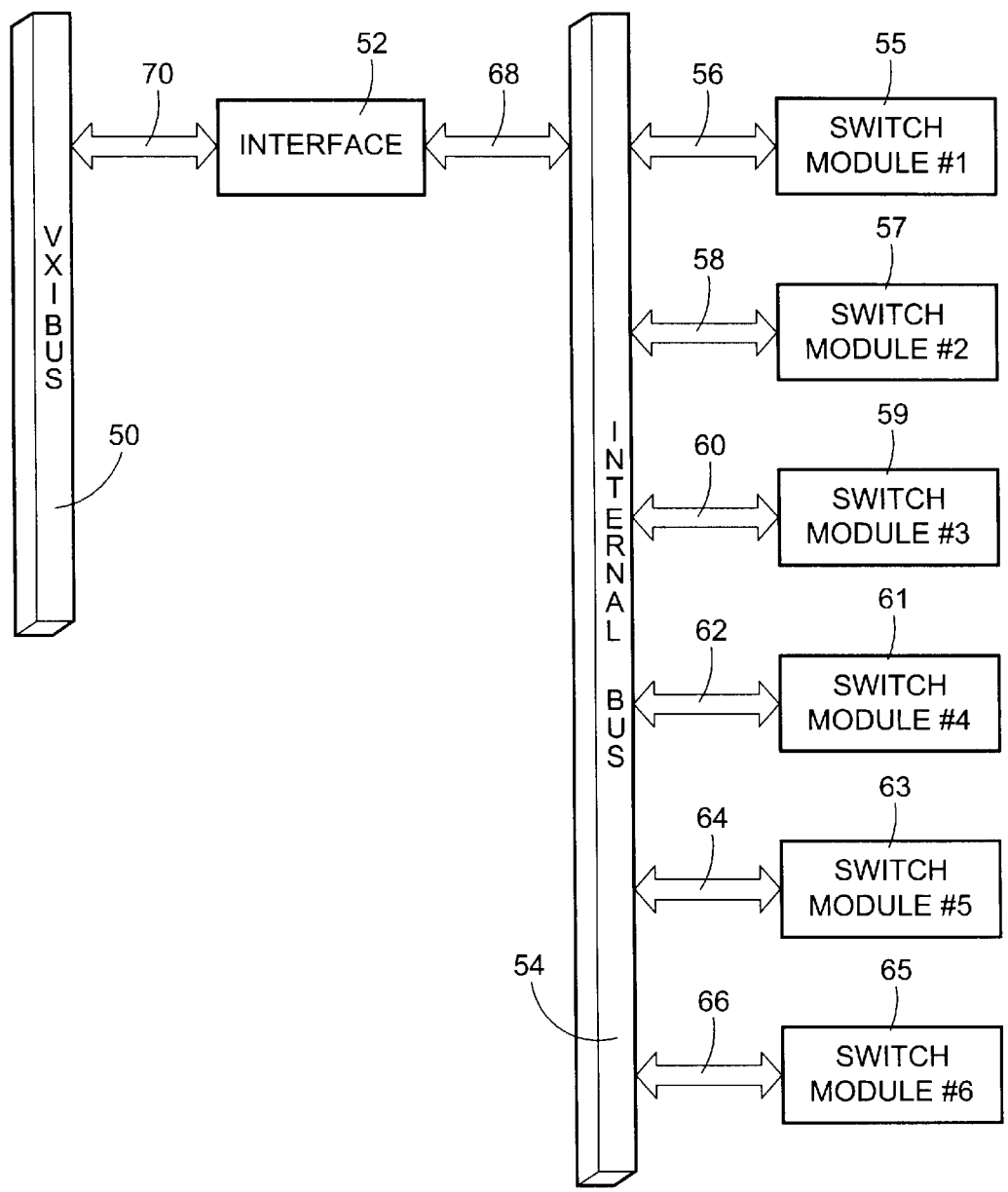
FIG. 6 is a block diagram showing the interconnections between the VXI bus and the switch modules.

Referring now to FIG. 6, a block diagram showing system functionality is shown. The VXI bus 50 is the standard VXI bus located in the VXI chassis. A VXI bus connector 70 provides communication from the VXI bus 50 to the interface 52. The interface 52 communicates with an internal backplane bus 54 via a communication link 68. The internal backplane bus is configured to accept one to six switch modules 55–65. Each switch module 55–65 is provided with an interconnect bus connector 56–66 for coupling to the internal backplane bus 54. The internal backplane bus 54 not only provides communication from the switch modules 55–65 to the interface 52, but allows communication between switch modules. For example, switch module 55 and switch module 57 may directly communicate thereby reducing communication overhead and speeding switch response.

Figure 14:
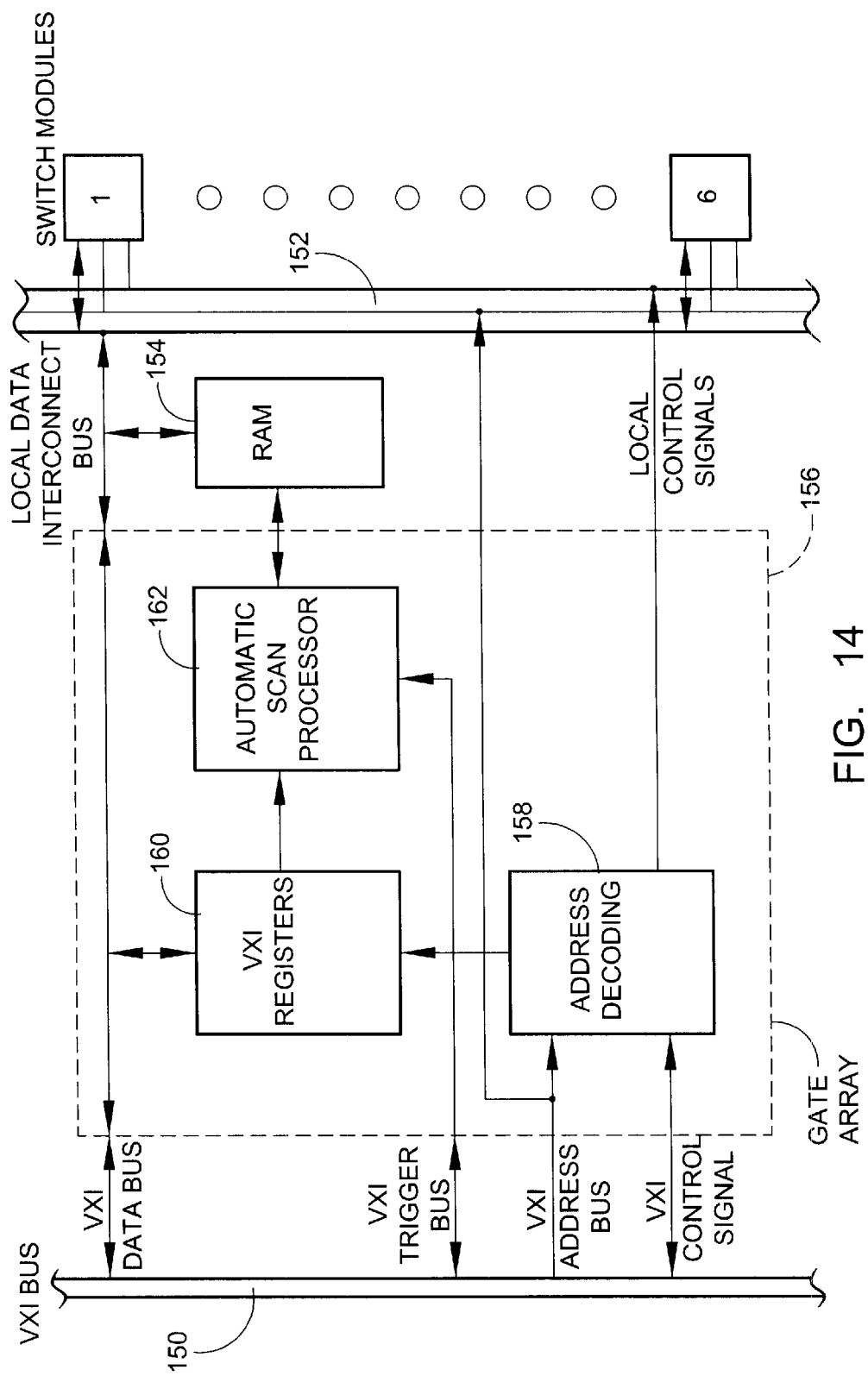
FIG. 14 is a block diagram of the functionality for the interface board.

The switch interface 52 is detailed below. Referring now to FIG. 14 the functionality of the switch interface is discussed. As disclosed earlier, the switch interface has a local interconnect bus connector 152 communicating with the installed switch modules. Further, the switch interface has communication connectors for communicating to the VXI bus 150. Further, the interface card has random access memory 154 and a gate array processor 156. The gate array processor contains address decoder 158 VXI, register control 160 and an automatic scan processor 162. The gate array implements a complete VXI bus interface and provides signal routing to the individual switch cards, control of the operation of the individual switch cards, and the automatic scanning of predetermined switch configurations as held in the random access memory 154 through the use of the VXI trigger bus. The automatic scan processor 162 provides a method for controlling each switch module relay states without acquiring VXI bus command activity.

Figure 2:
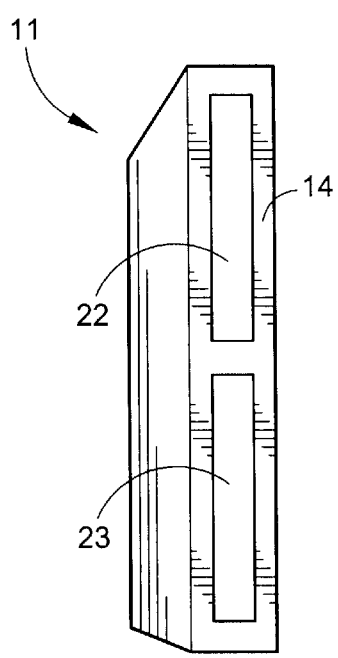
FIG. 2 is a diagrammatic perspective view of a single slot card frame made in accordance with the present invention.
Figure 4:
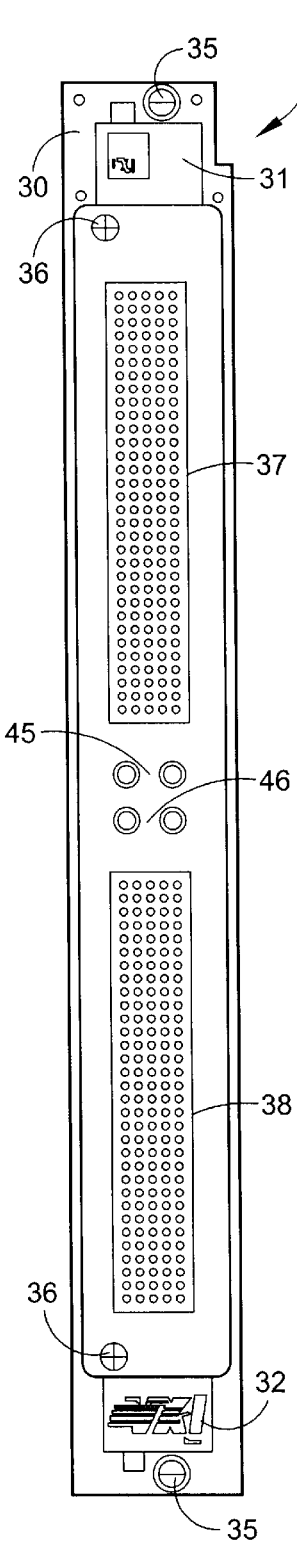
FIG. 4 is a front view of a single slot card frame having two switch modules made in accordance with the present invention.

FIG. 4 shows another module switch instrument card 11 made in accordance with the present invention. The module switch instrument card 11 is similar to the module switch instrument card 10 described above except modular switch instrument card 11 is configured into a single wide card frame 30. The single slot card frame 30 is attached to top and bottom support rails of a VXI chassis with support rail screws 35. Top support ejector and bottom support ejector 31 and 32 assist in inserting and removing the instrument card 11 from the VXI chassis. The front panel of the module instrument card 11 also contains switch module indicator lights 45 and 46. Referring now to FIG. 2, a single slot card frame 14 is shown having module access slots 22 and 23. As with the double wide configuration, these slots are covered unless a switch module is installed.

As with the double slot modular switch instrument card 10 described above, switch modules installed into the modular switch instrument card 11 connect to an interconnect bus. However, the interconnect board allows for a maximum of two switch modules, and is incorporated as part of the switch interface board. The interconnect bus provides communication to a gate array with the gate array enabling communication to the VXI backplane. The modular switch instrument card 11 is configured to allow each switch module to be installed individually with the switch modules fixedly attached to the card frame with screws. However, those skilled in the art will recognize that the switch modules may be configured to slide into the module receiving areas from the front panel.

The functionality of the gate array is further described in the Programming Section to the Switch Modular Interface Platform Preliminary Users Manual Revision Aug. 24, 1998. This section of the Preliminary Users Manual is attached to this application as Appendix A and is incorporated in its entirety by reference.

While particular embodiments of the present invention have been disclosed, it is to be understood that various different modifications are possible and are contemplated within the true spirit and scope of the appended claims. There is no intention, therefore, of limitations to the exact abstract or disclosure herein presented.

What is claimed is:

1. A modular switch instrument card for a VXI chassis, the VXI chassis having slots for receiving the modular instrument card, comprising;

a modular switch instrument card frame having a front panel and connectors to a VXI backplane, the modular switch instrument card providing a plurality of switch module receiving areas and a plurality of switch connector areas on the front panel;

a plurality of switch instrument modules, each switch instrument module having circuitry configured to provide selectable relay connections and to accept relay instruction signals for selecting electrical interconnection paths;

a switch interface communicating to the VXI backplane and positioned on the modular switch instrument card, the switch interface communicating to a local backplane bus so that the switch interface accepts relay switch commands from the VXI backplane and communicates the relay instruction to at least one of the switch instrument modules;

wherein each the switch instrument modules is mounted on at least one of the module receiving areas, respectively.

2. A modular switch instrument card according to claim 1 where the VXI chassis is a C sized chassis.

3. A modular switch instrument card according to claim 1 where the modular switch instrument card frame is a single slot VXI card and has a maximum of two switch module receiving areas.

4. A modular switch instrument card according to claim 1 where the modular switch instrument card frame is a double slot VXI card and has a maximum of six switch module receiving areas.

5. A modular switch instrument card according to claim 1 where the switch instrument modules are stacked, separated, and secured by screws to the instrument card.

6. A modular switch instrument card according to claim 1 where the switch instrument modules slide into the module receiving area from the front panel of the instrument.

7. A modular switch instrument card according to claim 1 where switch instrument module are selected from a group comprising power switches, general purpose switches, tree switches, multiplexer switches, and matrix switches.

8. A modular switch instrument card according to claim 1 where the switch interface detects that any of the module receiving areas does not have a switch instrument module tailed and emulates a bus response to the VXI backplane.

9. A modular switch instrument card according to claim 1 further comprising a module interconnect board that connects the installed switch instrument module to the local backplane bus.

10. A plurality of itch instrument modules for use in a VXII modular instrument card that connects to a VXI backplane, the VXI modular instrument card having a plurality of module receiving areas coupled to an interconnect bus, comprising:
- at least some of the plurality switch instrument modules constructed to provide a firs relay function, and at least some of the plurality of switch instrument modules constructed to provide a different relay function, each of the switch modules further comprising;
- a switch connector for communicating with an external test system;
- module mounting means for coupling the switch instrument module into the VXI modular instrument card oriented such that the switch connector extends out the front of the VXI instrument card;
- switch relay means for providing either the first relay function or the second relay function for the external test system coupled to the switch connector; and
- an interconnect bus connector coupling the switch means to the interconnect bus.

11. A switch instrument module according to claim 10 where the switch relaying means provides a power switching function.

12. A switch instrument module according to claim 10 where the switch relay means provide a general purpose switching function.

13. A switch instrument module according to claim 10 where the switch relay means provides a switching function selected from the group comprising power switches, general purposes switches, tree switches, multiplexer switches, and matrix switches.

14. A switch instrument module according to claim 10 where the switch module connects to a switch interconnect board in the VXI modular instrument card.

* * * * *